United States Patent [19]

Dalley

[11] 4,034,294
[45] July 5, 1977

[54] OVERLAP PCM CODER/DECODER WITH REACTION TIME COMPENSATION

[75] Inventor: James Edwin Dalley, Denver, Colo.

[73] Assignee: Bell Telephone Laboratories, Incorporated, Murray Hill, N.J.

[22] Filed: May 19, 1976

[21] Appl. No.: 687,624

[52] U.S. Cl. .................... 325/38 R; 340/347 AD; 179/15 A
[51] Int. Cl.² .................................... H04B 1/00
[58] Field of Search ........... 325/38 R, 38 A, 38 B; 340/347 AD, 347 CC; 179/15 AA, 15 A; 307/220, 224; 328/41, 48

[56] References Cited

UNITED STATES PATENTS

| | | | |
|---|---|---|---|
| 3,423,534 | 1/1969 | Pan | 179/15 |
| 3,882,484 | 5/1975 | Brokaw | 325/38 R |
| 3,883,864 | 5/1975 | Thomas | 325/38 R |
| 3,887,028 | 4/1975 | Thomas | 325/38 R |
| 3,928,725 | 12/1975 | Valbonesi | 179/15 AA |
| 3,931,531 | 1/1976 | Check | 307/220 R |

Primary Examiner—Benedict V. Safourek
Assistant Examiner—Michael A. Masinick
Attorney, Agent, or Firm—Howard R. Popper

[57] ABSTRACT

A PCM coder/decoder circuit is disclosed employing a counter that counts clock pulses until a transmitting ramp voltage equals that of an outgoing speech sample. The encoded count is transmitted in complemented form to the distant station where it is eventually entered into a counter similar to that of the transmitting station. Clock pulses are then applied to the receiving counter until a carry is generated at which time a receiving ramp waveform is disconnected from a decoding capacitor. The counter at the receiving station is enabled prematurely to generate the count so that the "reaction time" of the physical circuit components is compensated for. Compensation of this reaction time is important in reducing the nonlinear distortion that would otherwise be introduced when the ramp waveforms that are employed are of the companded type. The circuit operates in an overlap fashion, encoding and receiving in one field and decoding and transmitting in another field. Control time slots are interspersed between these fields and the control time slot intervals are advantageously employed to augment the code in the counter.

11 Claims, 4 Drawing Figures

OVERLAP PCM CODER/DECODER WITH REACTION TIME COMPENSATION

BACKGROUND OF THE INVENTION

This invention relates to digital signal switching systems and, more particularly, to such systems in which speech samples may be encoded into and decoded from pulse code modulation signals. In the pulse code modulation (PCM) arrangements to which the present invention is applicable, a sample of a speech signal is compared with a reference waveform. A counter, activated at the beginning of each sampling interval, is stopped when the reference waveform corresponds to the amplitude of the speech signal. The recorded count is then digitally transmitted to the remote terminal where the original speech signal may be reconstructed by employing the reference waveform and the received code in an inverse or decoding operation.

In J. F. O'Neill U.S. Pat. No. 3,860,761 issued Jan. 14, 1975, a digital progressive switching system is shown in which a single wire carries digitally-encoded voice signals and network control signals during predetermined time slot intervals. In the copending application of J. F. O'Neill Ser. No. 687,622, filed May 19, 1976 of even date herewith, an improved digital transmission system is shown in which the transmission delay and signal attenuation introduced in sending an encoded speech sample to a remote station of the telephone switching system may be compensated for by employing a delayed reference waveform having a different amplitude in the decoding operation than is employed in encoding the speech sample. Both the encoding and decoding waveforms that are employed are each advantageously nonlinear or companded so as to provide an acceptable signal-to-noise ratio over the entire dynamic range of the signal.

The use of a nonlinear or companded reference waveform, however, tends to introduce an undesired amount of nonlinear distortion. Because the reference waveform is steepest at both ends of the voltage comparison range (as it must be to compensate for the effects of quantizing noise), any finite delay in the operation of the physical circuit components occurring at these times will directly introduce nonlinear distortion. Such nonlinear distortion will be introduced, for example, by the finite and unavoidable delay in shutting off the counter when the reference waveform is recognized as being equal to the amplitude of the speech sample. Similarly, nonlinear distortion will be introduced by the circuit "reaction time" involved in disconnecting the decoding capacitor from the reference waveform when the received digital code is recognized.

In the aforementioned O'Neill U.S. Pat. No. 3,860,761 system, it was assumed that the digital encoding and decoding operations at a station set occurred during certain conveniently-assigned intervals of time. It would be advantageous, however, to permit the station set or line circuit to perform certain of these operations on an overlap basis. For example, it would be efficient to permit such a circuit to perform the coding operation for a to-be transmitted sample at the same time that it is receiving a signal over the link. During another interval of time, it would be useful to permit that same station to decode the signal it had received over the link at the same time that it transmits over the link the signal which it had previously encoded. To accomplish these overlap operations, the station at the distant end of the link must be performing the complementary pairs of simultaneous operations. It would be desirable to provide a circuit that permitted the aforementioned overlap operations to be performed so that whatever steps need be taken to correct for the previously-mentioned and unavoidable nonlinear distortion effects could be accomplished without interfering with such overlap operations.

SUMMARY OF THE INVENTION

The foregoing and other objects and features of my invention are attained in one illustrative embodiment in which the fields devoted to the transmitted and received pulse code modulated signals are separated by control time slot intervals. During certain of these control time slot intervals, as disclosed in the aforementioned U.S. Pat. No. 3,860,761, signals may be sent to control the extension of a link path between a calling and called station of the switching system. During others of these control time slots, and in accordance with the principles of my invention, two different kinds of clock pulse signals may be provided. The first type of clock pulse signal is provided to permit the efficient accomplishment of the aforementioned overlap operations so that a given station may, during one of the aforementioned fields, perform coding and receiving while the other remote station is performing decoding and sending operations. During a subsequent field, the operations performed by the nearby and the remote stations will be interchanged. The second type of clock pulse signal is provided to compensate for any tendency of the companded ramp sampling waveforms to introduce nonlinear distortions in the encoding or decoding of the speech sample.

In the illustrative embodiment, a counter is started during the field which at the local station is devoted to the encoding of a speech sample that is to be later transmitted to the remote station. At the same time that the counter is started, a companded ramp signal is compared with the amplitude of the speech sample and the counter is stopped at that time during the field when the ramp and speech sample amplitudes are determined to be equal. Also during this field, the PCM signal from the remote station is received in a shift register. During a subsequent field, the count accruing in the counter will be transmitted over the link to the remote station.

In between the occurrence of the field devoted to encoding and PCM signal reception and the subsequent occurrence of the field devoted to transmission (and decoding of the PCM signal), a control time slot interval is provided. During a first portion of the control time slot interval, the first of the aforementioned types of clock pulses are provided to transfer the accrued contents of the counter to the shift register for subsequent transmission therefrom over the link to the remote station. Simultaneously, the contents of the shift register is transferred to the counter. Thereafter and during a second portion of the control time slot intervals, the second of the aforementioned types of clock pulses are introduced into the counter to augment by a predetermined amount the digital "number", i.e., PCM code signal, received over the link from the remote station.

After the control time slot interval, the contents of the shift register are outpulsed over the link to the remote station and the counter is started at its augmented count. When the counter generates a carry signal, the amplitude attained by a receiving ramp generator that was started at the same time as the counter is transferred to the local station as the amplitude sample corresponding to the received PCM code. In accordance with the principles of my invention is this illustrative embodiment, the counter is forced by the introduction of the prepulses during the control time slot interval prematurely to generate the carry and thereby prematurely to terminate the receiving ramp signal. In so doing, the delay of the physical circuits in recognizing, inter alia, the presence of the carry signal, and in being able to respond thereto is compensated for. It is an advantage of the illustrative embodiment of my invention that the control time slot may also be employed to contain the "fly back" interval that must occur between the successive companded ramps respectively dedicated to transmission and reception of the PCM signals.

BRIEF DESCRIPTION OF THE DRAWING

The foregoing and other objects and features of my invention may become more apparent from the ensuing detailed description and drawing, in which.

DETAILED DESCRIPTION

Figure 1:
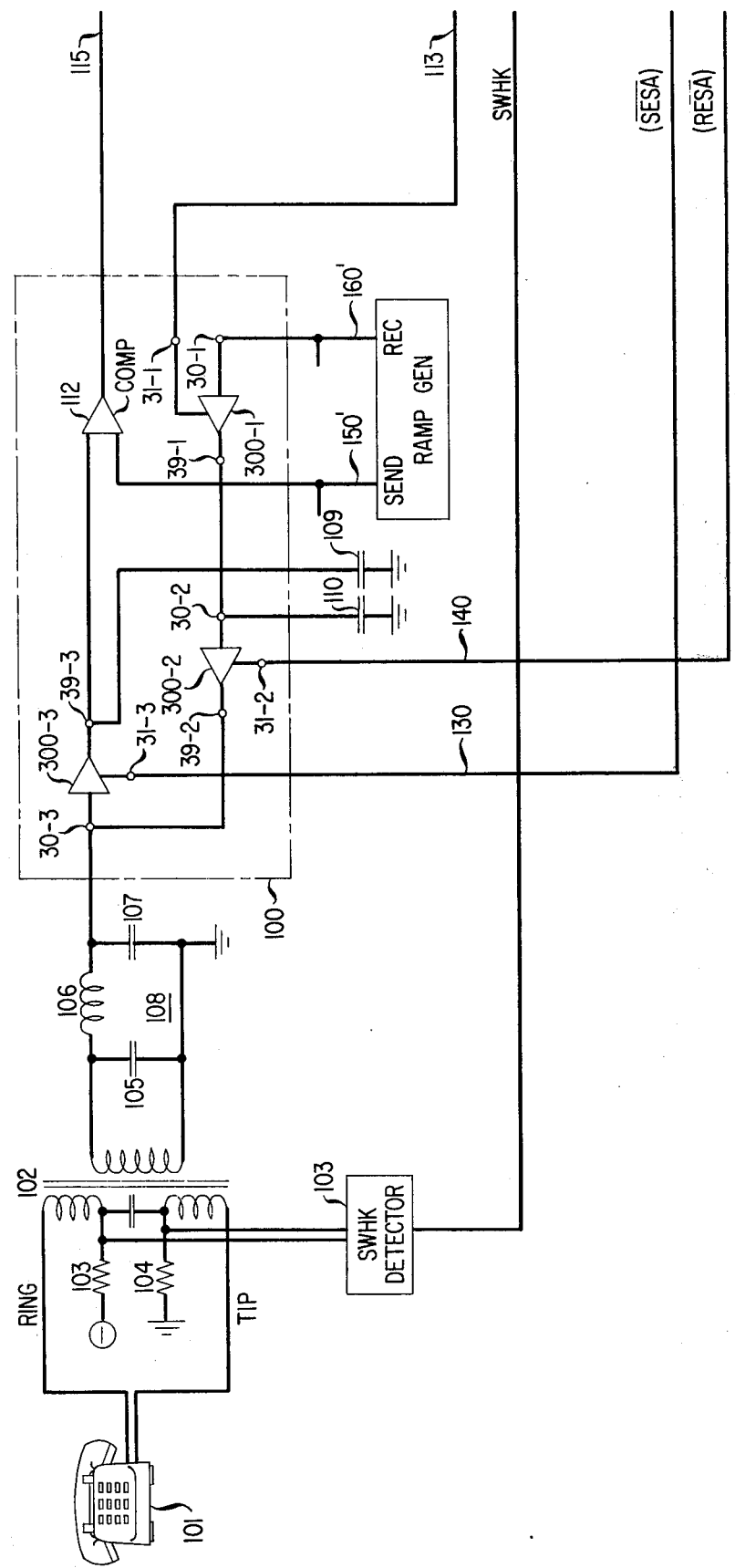
FIG. 1 shows a station set and a time division port circuit which advantageously may be similiar to that of the aforementioned copending J. F. O'Neill application Ser. No. 687,622, filed May 19, 1976 of even date herewith.

Referring now to FIG. 1, a station set 101, transformer 102, low-pass filter 108 and time division port circuit 100 are shown which are in most respects similar to the corresponding elements disclosed in the aforementioned copending J. F. O'Neill application. For ease of cross-reference, the same reference numbers are employed in FIG. 1 hereof as in that application. The operation of the circuitry of FIG. 1 hereof departs from the operation described in that application principally in the use of different ramp signals on leads 150' and 160'. These two signals are derived from the same compounded ramp; however, alternate fields are used for sending and receiving. For that reason, these lead designations are primed in FIG. 1 hereof. The nature of the signals applied to leads 150' and 160' may be ascertained from FIG. 3.

Let it be assumed that the station user had placed station set 101 in the off-hook condition and had employed the set's pushbuttons to transmit call signaling information so that a talking connection had been established. The talking connection would extend from station set 101 through low-pass filter 108 and time division port circuit 100 over lead 115 in the outgoing direction and over lead 113 in the return direction to the LINK shown at the extreme right-hand edge of FIG. 2. The intermediate circuitry of FIG. 2 between leads 115 and 113 at the left and the LINK at the right will hereinafter be described in some detail. To the right of the LINK, a "mirror image" of the circuiry shown in FIGS. 1 and 2 may be assumed to exist whereby the remote station (not shown) is reached. The same companded ramp signal is used by the circuit connected to the remote station, however, lead 150 would be active in field 1 and lead 160' would be active in field 2 (see FIG. 3). The terms local or near station and distant or remote station are used to help envision the operation of the system. Actually, the line circuits and associated equipment for both telephone stations may be located in close proximity to each other and each telephone station set may be located a considerable distance from the central equipmemnt cabinet (not shown) which houses the line circuit.

Figure 2:
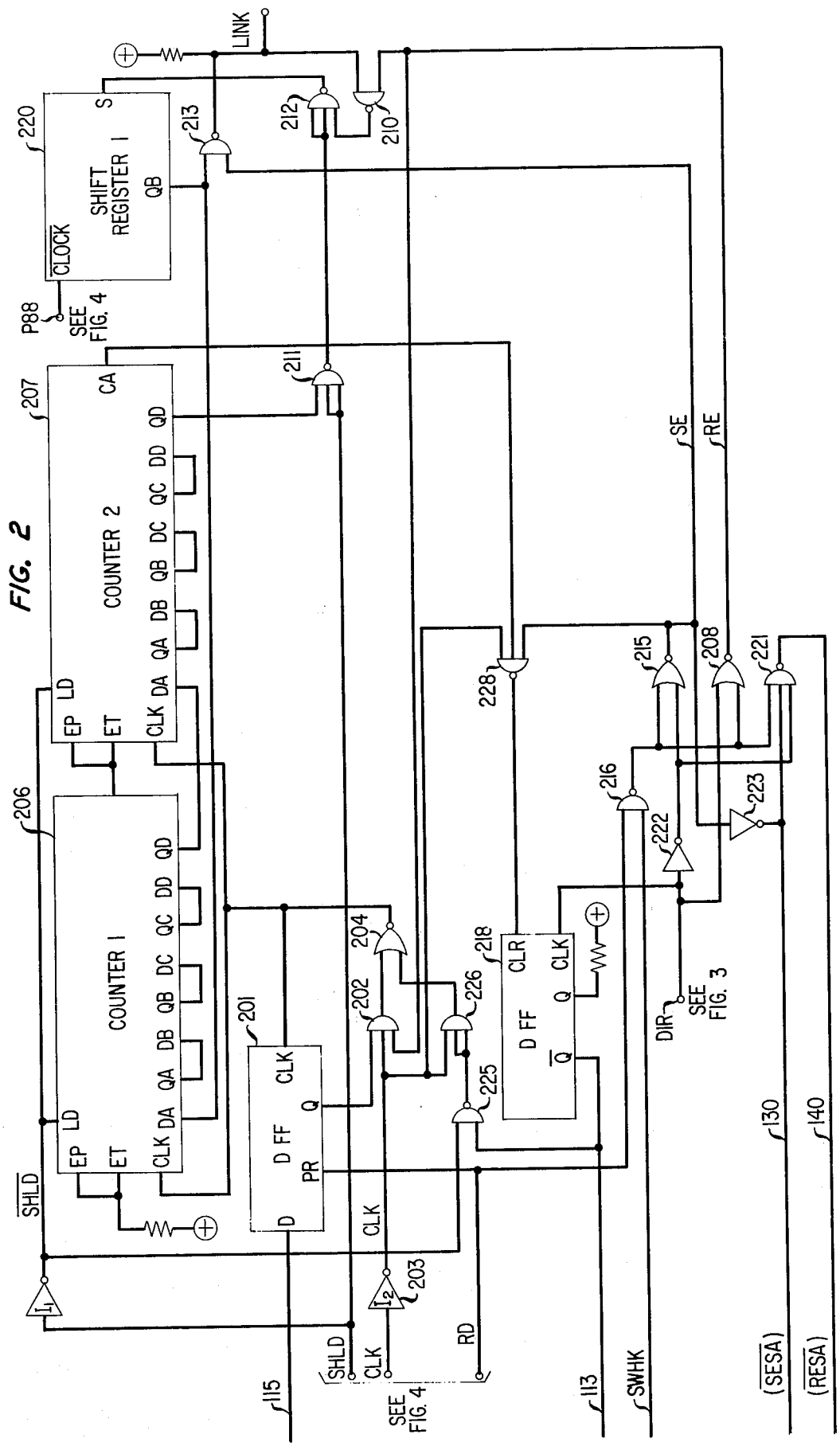
FIG. 2 shows the logic circuitry including the interchangeable counters and shift registers and the control logic therefor for performing the aforementioned overlap operations.
Figure 3:
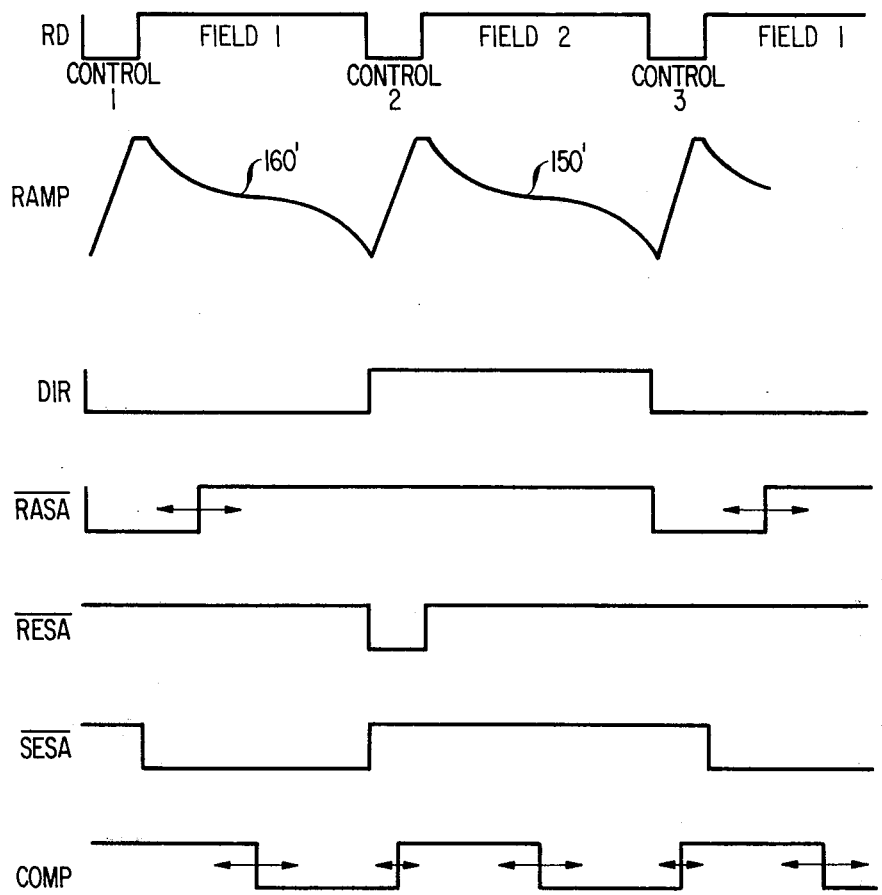
FIG. 3 shows the relationship of the PCM encoding-/receiving and decoding/sending fields with the intervening control time slot intervals.
Figure 4:
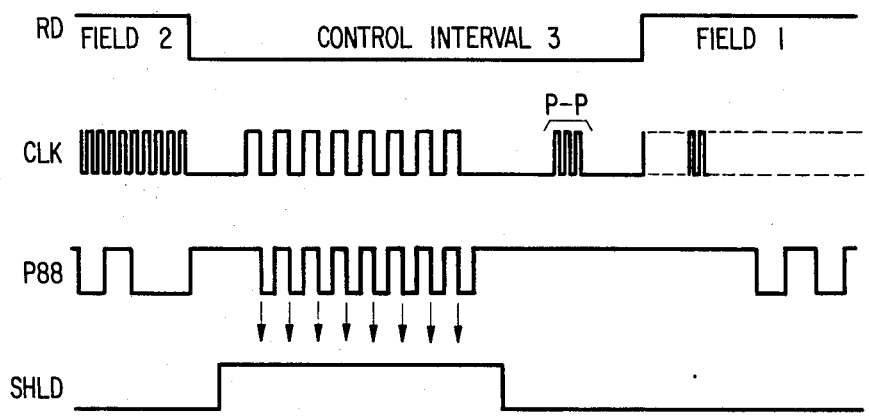
FIG. 4 details of the two types of clock signals employed during certain of the control time slot intervals.

The circuitry of FIG. 2 operates in such a manner during one time interval (field 2, FIG. 3) that at the same time that an outgoing analog speech sample produced on capacitor 107, FIG. 1 by the station user at station set 101 is being encoded in counters 206 and 207, an incoming PCM code signal appearing on the LINK from the remote station (not shown) may be received in shift register 220. The circuitry of FIG. 2 functions during a subsequent interval (field 1, FIG. 3) to permit the received PCM signal to be decoded to analog form for reception at set 101 at the same time that the priorly-encoded speech sample is placed on the LINK for transmission to the remote station. Between the field 1 and field 2 intervals, control time slot intervals are provided. The succession of control time slot intervals and digital transmission/reception fields are shown at waveform RD, FIG. 3. Waveforms RD and DIR of FIG. 3 and waveform SHLD, of FIG. 4 may be provided by conventional digital circuitry (not shown). Waveform RAMP of FIG. 3 is provided by a conventional companded ramp sweep generator (not shown). A single ramp generator serves all of the stations in its system. Likewise, crcuitry for generating the patterns of clock pulses CLK and P88 of FIG. 4 are also well known and are not detailed herein.

Returning now to FIG. 1, it will be recalled that gated signal switch 300-3 is gated on by the application of a low signal ($\overline{SESA}$, FIG. 3) to lead 130. The "send sampling" waveform $\overline{SESA}$ gates switch 300-3 on during field 1 of waveform RD. Switch 300-3 when gated on applies to capacitor 109 a voltage equivalent to that placed on the final shunt capacitor 107 by speech signals from station set 101. This voltage remains on capacitor 109 throughout control interval 2, field 2 and control interval 3.

Prior to the onset of field 2, the signal on lead RD, FIG. 2, is applied to the PR input of D flip-flop 201 to preset the Q output thereof to the high signal state. This enables the upper input of AND gate 202. During control time slot interval 2, the RAMP retrace signal, FIG. 3, occurs on lead 150', FIG. 1, causing comparator 112 to apply a high signal to lead 115. The high signal on lead 115 is applied to the D input of flip-flop 201, FIG. 2.

At the start of field 2 (see waveform RD, FIG. 3) the voltage on capacitor 109 applied to the upper input of comparator 112, FIG. 1, is compared against ramp waveform 150' applied at its lower input. The ramp signal starts at its most positive value at the beginning of each field. Each field in FIG. 3 has a duration of 25 $\mu s$, illustratively. The most positive signal level stored on capacitor 109 is constratined to be less than the maximum ramp signal. At the same time, the lower input of AND gate 202, FIG. 2, is enabled (in a manner hereinafter to be described) by the output of NOR gate 208. clock pulses, which advantageously may have a repetition rate of 10.24 MHz, are applied at terminal $\overline{CLK}$ of inverter 203 and pass through the center input of the enabled AND gate 202 and through NOR gate 204 to the CLK inputs of flip-flop 201 and of counters 206 and 207. counters 206 and 207 respond to the clock impulses from the start of field 2 until the arrival of the next $\overline{CLK}$ pulse occurring after comparator 112 applies a low signal on lead 115 incident to ramp 150' equaling the voltage on capacitor 109.

D flip-flop 201 is provided so that comparator 112 can only effect the cessation of clock pulse counting by counters 206 and 207 when the signal applied to the inputs of these counters is in the low state. This avoids the uncertainty that could be introduced if comparator 112 could block AND gate 202 in mid-clock pulse. When the low signal is applied to the D input of flip-flop 201, a low signal appears at the Q output thereof thereby blocking AND gate 202 from transmitting any further clock pulses to counters 206 and 207. Flip-flop 201 can now respond to no further changes on lead 115 until the signal on lead RD goes low at the end of field 2. Counters 206 and 207 are advantageously each 4-bit counters that are connected to act as an 8-bit counter so long as waveform SHLD (FIG. 4) applied at their upper inputs is in the low signal state. Such counters may, for example, be of the type known as WE41CJ manufactured by the Western Electric Company or type SN74163 manufactured by Texas Instruments. When waveform SHLD is in the high signal state during a portion of a control time slot interval (to be hereinafter described), counters 206 and 207 become a shift register.

At the same time that NOR gate 208 applies a signal on lead RE to enable AND gate 202 to pass clock pulses to counters 206 and 207 for the encoding operation, NOR gate 208 also enables NAND gate 210 to receive signals applied to the LINK terminal by the remote station (not shown). Since waveform SHLD is low, except during a portion of a control time slot interval, the output of NAND gate 211 is held high thereby enabling NAND gate 212 to apply incoming LINK signals passing through NAND gate 210 to the S input terminal of shift register 220.

During field 2 waveform P88, FIG. 4, applies to the $\overline{CLOCK}$ input of shift register 220 eight impulses at a 320 kHz rate. The negative-going transitions serially load eight bits of coded PCM data from the LINK into shift register 220. Any signals appearing at the Q8 output of register 220 during the loading operation are blocked at NAND gate 213 and at the DA input of counter 206. NAND gate 213 is blocked by the low signal at the output of NOR gate 215 and counter 206 is precluded from responding to any signals presented at its DA input so long as waveform SHLD (FIG. 4) is low.

Control of leads SE and RE (FIG. 2)

It was stated above that NOR gate 208 maintains lead RE, the lower input of AND gate 202 and the lower input of NAND gate 210 in the high signal state during the occurrence of field 2 of waveform RD, FIG. 3. The signal applied on lead RD at the left-hand side of FIG. 2 follows the corresponding waveform of FIG. 3. Accordingly, during field 2, the upper input of NAND gate 216 receives a high signal enabling the gate to respond to the switchhook state of set 101 which is applied to terminal SWHK by conventional switchhook status sensing circuitry 103. When set 101 is off-hook, both of NAND gate 216's inputs are high during the active fields and the output of gate 216 enables NOR gate 215 and 208.

Waveform DIR, FIG. 3, is applied to the corresponding input terminal at the left of FIG. 2 and, over an intermediate path not necessary to be described herein, effects control of the status of the CLK input of D flip-flop 218 and NOR gate 208. The inverse of the DIR signal is applied to the lower inputs of NOR gate 215 and of NAND gate 221. Because of the operation of inverter 222, NOR gates 215 and 208 are enabled to follow the switchhook state information at the output of NAND gate 216 at different times. Assuming that station 101 is in the off-hook and calling state, the lower inputs of NOR gate 215 and of NAND gate 221 will both be low during field 1 thereby providing a high signal on lead SE at the output of gate 215. As station set 101 returns to the on-hook state, lead SE at the output of lead 215 will be held in low signal condition. Likewise, lead RE at the output of gate 208 will assume the high signal state during field 2 so long as set 101 is in the off-hook calling state.

First Serial Data Swap

The first serial data swap occurs during control time slot interval 3 following the end of field 2. At this time, the outputs of NOR gates 215 and 208, respectively, apply low signals to leads SE and RE. The low signals on leads SE and RE block gates 210 and 213 from receiving from or transmitting to the LINK. During a portion of control time slot interval 3, however, waveform SHLD goes to the high signal state enabling NAND gate 211 to respond to the QD output of counter 207 and to apply that output via NAND gate 212 to the S input of shift register 220. The Q8 output of shift register 220 is connected to the DA input of counter 206.

When waveform SHLD is in the high signal state, a low input signal is applied to the upper inputs of counters 206 and 207 causing these counters to operate as one 8-bit or "long" shift register. It is to be noted that the QA output of counter 206 is connected to its DB input, its QB output is connected to its DC input, and its QC output is connected to its DD input. The QD output of counter 206 is connected to the DA input of counter 207 and the outputs QA, QB and QC of counter 207 are resepectively connected to its inputs DB, DC and DD.

The contents of shift register 220 will be serially transferred from its Q8 output into the DA input of counter 206 responsive to the P88 waveform pulses applied to the $\overline{CLOCK}$ input terminal of register 220 during the control time slot interval detailed in FIG. 4. From FIG. 4, it is also seen that at this time waveform CLK provides eight negative-going transitions that correspond to the negative-going transitions of waveform P88. These negative-going transitions are applied via AND gate 226 and NOR gate 204 to the CLK input terminals of counters 206 and 207. AND gate 206 is enabled to pass these transitions by NAND gate 225 whose output is held in the high signal state by the low signal of the $\overline{RASA}$ waveform on lead 113 during control time slot interval 3.

As each bit of coded data is applied to input terminal DA of counter 206 from register 220, it is shifted by the clock pulses to a succeeding one of the eight stages of counters 206 and 207 (operating as a "long" shift register). Of course, at the same time that the contents of shift register 220 is being entered at the counter 206 and 207, the count, that had been accrued therein during the encoding operation taking place during the preceding field 2, is entered through NAND gates 211 and 212 into shift register 220. Accordingly, the data received over the LINK that was in shift register 220 prior to the onset of control time slot interval 3 has been entered into the counters 206 and 207, and the encoded data that was in counters 206 and 207 has been entered into shift register 220. This transpired during the first portion of control time slot interval 3. During the second portion of control time slot interval 3, see FIG. 4, waveform SHLD returns to its low signal state. A predetermined number of prepulses p—P, that are included in waveform CLK following the eight negative-going transitions, are now effective to augment the contents of counters 206 and 207. This augmentation is possible because during the second portion of control time slot interval 3, waveform SHLD returns to its low signal state reconfiguring counters 206 and 207 from a "long" shift register to a counter. The prepulses P—P applied to the CLK inputs of counters 206 and 207 augment the PCM code that had been received from the LINK via shift register 220 by a predetermined amount. The significance of this predetermined augmenting will appear hereinafter.

Decoding and Sending

It was mentioned above that the waveform $\overline{RASA}$ appearing on lead 113 went low at the onset of control time slot interval 3. This permits gated signal switch 300-1, FIG. 1, to follow the retrace of the RAMP waveform on lead 160'. Another field 1 follows control time slot interval 3. At the onset of this field 1, the receive RAMP signal 160' is applied to gated signal switch 300-1 and the RAMP will remain applied so long as the $\overline{RASA}$ waveform on lead 113 remains low incident to the decoding operation. The decoding operation ceases, as will hereinafter be explained, when counter 207 generates a carry signal.

At the onset of this field 1 (which follows after control time slot interval 3) waveform RD returns to its high signal state and NAND gate 216 reapplies a low signal to the upper input of NOR gate 215. The lower input of gate 215 also has a low signal applied thereto at this time and, consequently, gate 215 applies a high signal to lead SE. The high signal on lead SE enables gate 213 thereby connecting the Q8 output of shift register 220 to the LINK.

At the same time, the low signal of the $\overline{RASA}$ waveform (via NAND gate 225) enables AND gate 226 to apply clock pulses to the CLK terminals of counters 206 and 207. These counters, it will be recalled, contain the PCM code received over the LINK (via shift register 220), as augmented during control time slot interval 3 by the prepulses P—P. The PCM code contained by the counters is actually the complement of the original PCM code word. This will be discussed in more detail later. The clock pulses applied to counters 206 and 207 during field 1 now further augment the count until counter 207 generates a carry signal at its CA output. Advantageously, the carry may be generated at the count of 255.

The carry output from counter 207 and the high signal placed on lead SE by gate 215 enable NAND gate 228. When the clock pulse applied to the CLK inputs of counters 206 and 207 goes low to drive the counters, the clock pulse that is applied to the upper input of gate 228 goes high causing the output of gate 228 to go low. This low signal clears flip-flop 218. When flip-flop 218 is cleared, its Q output causes the $\overline{RASA}$ waveform on lead 113 to return to the high signal state. When the carry output is generated and gated signal switch 300-1 cuts off the RAMP waveform, capacitor 110 has reached a voltage amplitude corresponding to the PCM code that was received over the LINK. When waveform $\overline{RASA}$ is returned to its high signal state by flip-flop 218, gate 225 blocks AND gate 226 and prevents any further clock pulses from reaching counters 206 and 207.

Referring again to FIG. 4, it will be noted that during the field 1 which follows control time slot interval 3, waveform P88 applies a sufficient number of pulses, advantageously at a 320 kHz rate, to serially shift out the contents of register 220 through enabled gate 213 to the LINK. Gate 213, however, inverts each data bit as it is passed to the LINK and the "value" of the data thus transmitted to the remote station (not shown) is the complement of the shift register contents. This same operation, of course, transpired incident to the transmission of signals from the remote station (not shown) into shift register 220 when that shift register was used to receive signals incoming over the LINK. The transmission of complemented bit values permits the decoding of the received PCM code to be performed in counters 206 and 207 by simply augmenting the code, as if it were a count, until a carry is generated. It is also the reason that the prepulses may be employed to compensate for the circuit "reaction time" by augmenting the received code so that it will generate the carry signal earlier.

While the 8-bit contents of shift register 220 are being shifted out by the P88 pulses, NAND gate 212 loads the shift register with eight zeros.

In addition to the foregoing operations, waveform $\overline{SESA}$, FIG. 3, goes low at the onset of the field 1 being described because gate 223 inverts the high signal placed on lead SE by gate 215. The low signal of the $\overline{SESA}$ waveform applied to lead 130 enables gated signal switch 300-3, FIG. 1, to transfer a new voltage sample from capacitor 107 to capacitor 109 in the same manner as was described hereinbefore for the first field 1 occurrence.

Second Serial Data Swap

During the fourth control interval, i.e., one which follows the termination of the field 1 (which has just been described as the one that followed the termination of control time slot interval 3), a second data swap is accomplished. The second data swap is accomplished in similar fashion to the manner in which the first data swap, described above, was performed except, of course, that the data is different. Shift register 220 at the onset of this fourth control time slot interval is loaded with eight zeros and counters 206 and 207 have the count of 255 therein. When the P88 pulses are applied to register 220 and waveform SHLD is high, the clock pulses that are applied to counter 206 and 207 produce the serial data swap. Counters 206 and 207 receive eight zeros and are thus reset to a count of zero. Shift register 220 obtains the number 255. Counters 206 and 207 are thus preset for the arrival of the next field 2 at which point they can commence the encodement of a new voice sample under control of comparator 112. The number 255 that is entered into shift register 220 will be read out of its Q8 output (during this next field 2) as data is received over the LINK, but as mentioned before, the Q8 output will be ineffective at that time to affect the operation of the remainder of the circuit.

It should be noted that waveform CLK, FIG. 4, may also contain the prepulses P—P during this fourth control time slot interval. These prepulses cannot reach counters 206 and 207 since gate 225 blocks the transmission of clock pulses to these counters after waveform SHLD goes low except when waveform RASA is present in its low state (as it was during control time slot interval 3). Accordingly, counters 206 and 208 remain reset at the count of zero at the termination of this fourth control time slot interval.

For purposes of facilitating a review of the foregoingly-described operations, a summary thereof is presented in the ensuing table. This table is, however, but an abbreviated presentation of what has been said above but may be useful for tutorial purposes.

TABLE

| Waveform RD | Operations |
| --- | --- |
| Control 1 | — |
| Field 1 | $\overline{SESA}$ low:Send sample and hold. |
| Control 2 | — |
| Field 2 | Comp. 112 controls counters 206, 207 (Encoding). S/R 220 receives code from LINK (Receiving). |
| Control 3 | SHLD high:206,207 are "long" shift-register. S/R 220 and 206,207 perform first data swap. SHLD low:Prepulses P-P augment code in 206,207. |
| Field 1 | P88 sends contents of S/R 220 to LINK (Transmitting). |
| | $\overline{RASA}$ goes high when 207 generates carry (Decoding). |
| Control 4 | Reset 206,207 from eight "0's" in S/R 220 (Second Data Swap). |
| | $\overline{RESA}$ goes low: LPF 108 impulse driven by 300-2 from 110. |

In FIGS. 3 and 4, the relationship among the waveforms has been shown and has been described hereinabove in terms of four control time slot intervals. It is to be appreciated, however, that a "frame" containing a number of transmit and receive fields, interspersed with control time slot intervals, may contain more than four such control time slot intervals and that the delineation of specific control functions during such intervals does not preclude the possibility of additions to, or repetitions of some or all, of the control functions during the same or others of these control time slot intervals. Further and other modifications will be apparent to those of skill in the art and may be accomplished without departing from the spirit and scope of my invention.

What is claimed is:

1. An arrangement for compensating both
  a. for the time between the time of attainment of a predetermined count by a counter commencing to count clock pulses at an initial count determined by a received binary code pattern and the time a ramp signal is decoupled from a first analog signal storage device, and
  b. for the time between the time said ramp signal equals the amplitude of a signal on a second analog signal storage device and the time said counter is disconnected from said clock pulses, comprising:
  means defining a sequence of successive field intervals during a first of which said ramp signal is connected and disconnected from said second analog signal storage device and during the second of which said clock pulses are coupled and decoupled from said counter; and
  means operative intermediate successive ones of said field intervals for augmenting by a predetermined amount, the count corresponding to said received code pattern.

2. An arrangement according to claim 1, wherein said means operative intermediate said successive field intervals comprises:
  register means having received therein said binary code pattern during said first of said successive field intervals; and
  means for interchanging the contents of said register means with the contents accruing in said counter prior to said augmenting of said count by said predetermined amount.

3. The arrangement of claim 2, wherein said means defining said sequence of successive field intervals includes means defining a first control interval intermediate said first and said second successive field intervals and a second control interval following said second of said field intervals.

4. The arrangement of claim 3, further comprising means defining a first portion of one of said control intervals for enabling said contents interchanging means and a second portion of said same control interval for enabling said augmenting means.

5. The arrangement according to claim 4, further comprising means for loading said register means with a binary zero incident to transmitting each bit of the binary code pattern thereof to a remote point; and means operative during said second of said control intervals for again interchanging the contents of said register means and said counter to reset said counter after said code pattern has been transmitted.

6. A pulse code modulation system comprising:
  means for generating a binary pattern approximating the instant within a counting interval at which a companded ramp waveform and an analog sample correspond;
  means for receiving said binary pattern at a decoder;
  means associated with said decoder for connecting a second companded ramp waveform to an analog signal storage device throughout an interval of time measured by clock pulses, said interval of time being approximated by the number of clock pulses constituting a translation of said binary code pattern; and
  means for compensating for the degree of said first and second mentioned approximations due to the reaction time in detecting said instant and said interval including means for altering said binary pattern prior to connecting said waveform to said storge device.

7. A circuit for decoding a binary code pattern into an analog signal comprising:
  means defining a sequence of successive field intervals and shorter duration control time slots intermediate successive ones of said field intervals;
  register means operative during a first one of said field intervals for receiving said binary pattern;

counter means;

means operative during one portion of a succeeding one of said control intervals for transferring said received binary pattern to said counter;

means operative during another portion of said one of said control intervals for augmenting the contents of said counter by a predetermined amount; and means operative during a subsequent one of said field intervals for measuring the interval of time required to cause said counter to attain a predetermined count.

8. In a circuit for coupling a companded ramp signal source to a sampling capacitor for an interval of time determined by a code pattern registered in a counter, the improvement comprising:

means for transferring said pattern into said counter during a first interval of time;

means for artificially augmenting said count by a predetermined amount during a second interval of time; and means thereafter operative to couple a source of time-interval-defining clock pulses to said counter until said predetermined count is attained, said predetermined amount of count augmenting corresponding to an ascertainable number of said clock pulses.

9. In a PCM coder/decoder arrangement for a communication switching system, the combination comprising:

a counter for receiving an input PCM signal from a local station;

a shift register for receiving a PCM signal from a remote station;

means for interchanging the contents of said counter and said shift register;

means for augmenting the count of said counter by a predetermined amount above the contents interchanged from said shift register; and means responsive to a carry signal from said counter for transferring to the local station an analog speech signal.

10. In a PCM coder/decoder arrangement, the combination in accordance with claim 9, further comprising means responsive to the comparison of a companded ramp signal and the amplitude of a speech signal for applying said input PCM signal to said counter.

11. In a PCM coder/decoder arrangement, the combination in accordance with claim 10, wherein said transferring means includes means for generating a receiving ramp signal and means responsive to said carry signal for said controlling receiving ramp signal generating means.

* * * * *